US012772787B2

(12) United States Patent
ter Vrugt

(10) Patent No.: US 12,772,787 B2
(45) Date of Patent: Oct. 20, 2026

(54) SYSTEM FOR PROCESSING SEMICONDUCTOR WAFER STORAGE CASSETTES, COMBINATIONS, AND METHOD OF TRANSPORTING

(71) Applicant: ASM IP Holding B.V., Almere (NL)

(72) Inventor: Erik ter Vrugt, Rheden (NL)

(73) Assignee: ASM IP Holding B.V., Almere (NL)

( * ) Notice: Subject to any disclaimer, the term of this patent is extended or adjusted under 35 U.S.C. 154(b) by 488 days.

(21) Appl. No.: 18/366,012

(22) Filed: Aug. 7, 2023

(65) Prior Publication Data

US 2024/0047252 A1 Feb. 8, 2024

Related U.S. Application Data

(60) Provisional application No. 63/395,972, filed on Aug. 8, 2022.

(51) Int. Cl.

| | |
|---|---|
| ***H10P 72/10*** | (2026.01) |
| ***H01F 7/02*** | (2006.01) |
| ***H01F 7/20*** | (2006.01) |
| ***H10P 72/00*** | (2026.01) |
| ***H10P 72/30*** | (2026.01) |

(52) U.S. Cl.

CPC ....... *H10P 72/3204* (2026.01); *H01F 7/0236* (2013.01); *H01F 7/206* (2013.01); *H10P 72/0431* (2026.01); *H10P 72/3218* (2026.01); *H01F 2007/208* (2013.01)

(58) Field of Classification Search

None

See application file for complete search history.

(56) References Cited

U.S. PATENT DOCUMENTS

| | | | | |
|---|---|---|---|---|
| 5,360,470 A * | 11/1994 | Ono | F16C 32/044 | 104/284 |
| 6,777,833 B1 * | 8/2004 | Williams | H02K 41/03 | 310/90.5 |
| 11,378,337 B2 * | 7/2022 | Fluit | F27D 3/0084 | |
| 11,527,424 B2 * | 12/2022 | Berger | H10P 72/0456 | |
| 12,106,991 B2 * | 10/2024 | Hudgens | H10P 72/3204 | |

(Continued)

FOREIGN PATENT DOCUMENTS

| | | | |
|---|---|---|---|
| KR | 20040090100 A * | 10/2004 | B01D 46/42 |
| WO | WO-2020045846 A1 * | 3/2020 | H01L 21/677 |

(Continued)

*Primary Examiner* — Sylvia Macarthur

(74) *Attorney, Agent, or Firm* — Banner & Witcoff, Ltd.

(57) ABSTRACT

A system for processing semiconductor wafer storage cassettes, comprising: a vertical batch furnace assembly configured to process a semiconductor wafer storage cassette, the vertical batch furnace assembly comprising a vertical batch furnace configured to process wafers from the cassette. The system may further comprise a floor assembly arranged at the vertical batch furnace assembly, the floor assembly comprising a two-dimensional array of electromagnets arranged below a top surface of the floor assembly, the array extending along the top surface; and at least one platform assembly comprising a magnet and configured to support at least one of the cassettes thereon, wherein the system is configured for levitating the at least one platform assembly above the top surface of the floor assembly.

9 Claims, 4 Drawing Sheets

(56) References Cited

U.S. PATENT DOCUMENTS

| | | | | |
|---|---|---|---|---|
| 2003/0129045 | A1 * | 7/2003 | Bonora | H10P 72/3411 414/217 |
| 2008/0094603 | A1 * | 4/2008 | Lee | F16C 39/063 318/135 |
| 2020/0111692 | A1 * | 4/2020 | Newman | H10P 72/0452 |
| 2020/0190660 | A1 * | 6/2020 | Ogawa | C23C 14/568 |
| 2020/0365433 | A1 | 11/2020 | De Ridder | |
| 2021/0035824 | A1 * | 2/2021 | de Ridder | H10P 72/3218 |
| 2021/0035841 | A1 * | 2/2021 | Fluit | F27D 15/02 |
| 2021/0111053 | A1 * | 4/2021 | de Ridder | H10P 72/3402 |
| 2024/0047252 | A1 * | 2/2024 | Ter Vrugt | H10P 72/3204 |

FOREIGN PATENT DOCUMENTS

| | | | | |
|---|---|---|---|---|
| WO | WO-2020057739 | A1 * | 3/2020 | H01L 21/67709 |
| WO | 2022106555 | A1 | 5/2022 | |

* cited by examiner

SYSTEM FOR PROCESSING SEMICONDUCTOR WAFER STORAGE CASSETTES, COMBINATIONS, AND METHOD OF TRANSPORTING

CROSS-REFERENCE TO RELATED APPLICATION(S)

This Application claims the benefit of U.S. Provisional Application 63/395,972 filed on Aug. 8, 2022, the entire contents of which are incorporated herein by reference.

FIELD OF INVENTION

The invention concerns a system for processing semiconductor wafer storage cassettes, comprising a vertical batch furnace assembly configured to process such a cassette, the vertical batch furnace assembly comprising a vertical batch furnace configured to process wafers from the cassette.

BACKGROUND

US2020/0365433A1 discloses an example of a vertical batch furnace assembly. In general, systems comprising such vertical batch furnace assemblies are known for processing semiconductor wafer storage cassettes, wherein in particular wafers held in the cassettes may be processed in the vertical batch furnace of the vertical batch furnace assembly. Semiconductor wafer storage cassettes are known in various forms, for example in the form of a Front Opening Unified Pod, or FOUP. Typically, the processing of such cassettes is performed using relatively complex robotic assemblies, e.g. for transportation, positioning, transferring and/or storage of the cassettes, e.g. before and/or after processing of wafers from the cassette by the vertical batch furnace.

SUMMARY

It may be an objective to provide a system for processing semiconductor wafer storage cassettes.

To that end, a first aspect provides a method of transporting at least one semiconductor wafer storage cassette with respect to a vertical batch furnace of a vertical batch furnace assembly. The method comprises: providing, at the vertical batch furnace assembly, a floor assembly comprising a two-dimensional array of electromagnets arranged below a top surface of the floor assembly, the array extending along the top surface; providing at least one platform assembly comprising a magnet; supporting at least one semiconductor wafer storage cassette on the at least one platform assembly; levitating the at least one platform assembly above the top surface of the floor assembly using magnetic interaction between the array of electromagnets and the magnet of the platform assembly; and moving the levitated at least one platform assembly with the at least one cassette supported thereon with respect to the floor assembly by controlling the electromagnets in a variable manner so as to vary the magnetic interaction, thereby transporting the at least one cassette with respect to the vertical batch furnace. The transporting may include positioning a cassette of the at least one cassette at a door opener device associated with the vertical batch furnace assembly, the door opener device being arranged at an outer edge of the floor assembly and being configured to engage a door of a cassette supported on at least one of the at least one platform assembly while the floor assembly positions the at least one platform assembly at the door opener device.

A second aspect provides a system for processing semiconductor wafer storage cassettes, comprising: a vertical batch furnace assembly configured to process a semiconductor wafer storage cassette, the vertical batch furnace assembly comprising a vertical batch furnace configured to process wafers from the cassette; a floor assembly arranged at the vertical batch furnace assembly, the floor assembly comprising a two-dimensional array of electromagnets arranged below a top surface of the floor assembly, the array extending along the top surface; at least one platform assembly comprising a magnet and configured to support at least one of the cassettes thereon; and a controller operatively connected to the electromagnets of the floor assembly. The system is configured for levitating the at least one platform assembly above the top surface of the floor assembly using magnetic interaction between the array of electromagnets and the magnet of the platform assembly. The controller is configured for controlling the electromagnets in a variable manner so as to vary the magnetic interaction for thereby moving the levitated at least one platform assembly with the at least one cassette supported thereon with respect to the floor assembly so as to transport the at least one cassette with respect to the vertical batch furnace for processing of wafers from the cassette by the vertical batch furnace. For the processing of the wafers, the system may further comprise a door opener device arranged at an outer edge of the floor assembly and configured to engage a door of a cassette supported on at least one of the at least one platform assembly while the floor assembly positions the at least one platform assembly at the door opener device.

The system may be used for processing at least one semiconductor wafer storage cassette.

The system may be combined with and/or comprise at least one semiconductor wafer storage cassette, wherein at least one cassette of the at least one cassette is supported on at least one platform assembly of the at least one platform assembly.

The system may be combined with and/or comprise a plurality of cassette processing stations arranged at mutually different positions along an outer edge of the top surface of the floor assembly, at least one of the cassette processing stations being comprised by or comprising the vertical batch furnace assembly.

Such a method and system advantageously enable various simplifications, in particular mechanical simplifications, in the processing of semiconductor wafer storage cassettes. For example, the floor assembly and platform assemblies can replace one or more assemblies and/or elements traditionally used in such processing, such as carousel assemblies, turn table assemblies, handler robots and pneumatic elements. Moreover, versatility can be increased, in particular with respect to movement paths of cassettes. Furthermore, maintenance can be reduced, in particular since the number of mechanically engaged moving parts can be reduced.

It shall be appreciated that the method described herein may be performed using and/or by the system described herein, and that the system may be configured to perform one or more, e.g. all, steps of the method.

In the following, the invention will be explained further using examples of embodiments and drawings.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Figure 1:
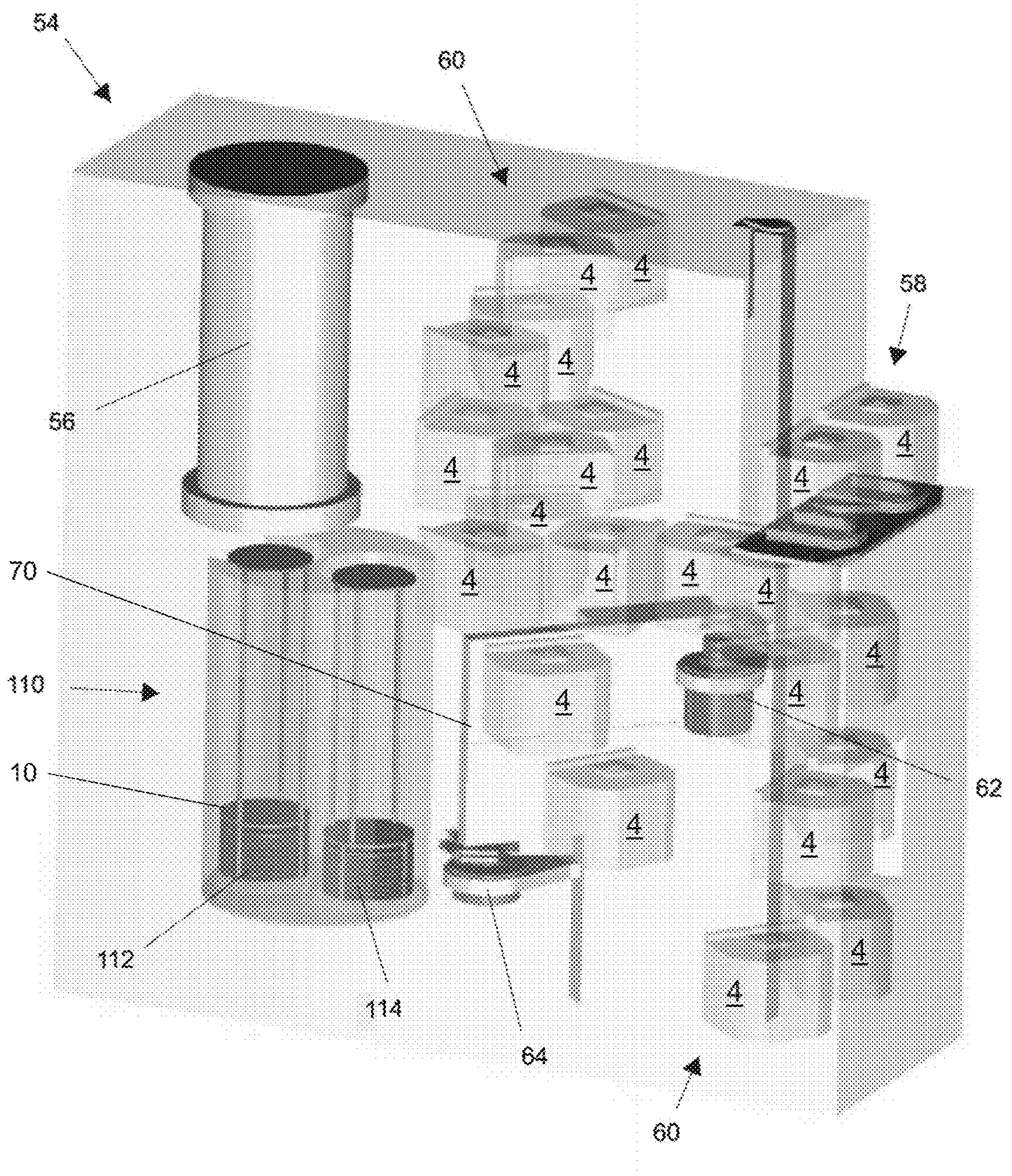
Fig. 1 PRIOR ART
FIG. 1 shows a semi-transparent perspective view of a known vertical batch furnace assembly.

FIG. 1 shows a vertical batch furnace assembly 54 known from US2020/0365433A1. The vertical batch furnace assembly 54 comprises a process chamber 56 for processing wafers 10 accommodated in a wafer boat, and a wafer boat handling device 110 positioned under the process chamber 56, provided with a wafer boat lift assembly configured to transfer a wafer boat 112, 114 from the wafer boat handling device 110 to the process chamber 56 and vice versa. The vertical batch furnace assembly 54 here further comprises: two cassette in-out ports 58, arranged adjacent to each other; a cassette storage 60 configured to store a plurality of substrate cassettes 4 each of which comprises wafers; a cassette door opener device 70 and a cassette handler 62 configured to transfer substrate cassettes 4 between the cassette in-out port 58, the cassette storage and the door opener device 70. The cassette storage 60 is here embodied as a cassette storage carousel. The vertical batch furnace assembly 54 here comprises multiple cassette storage carousels. The vertical batch furnace assembly 54 here also comprises a wafer handler 64 configured to transfer wafers between a cassette 4 in the door opener device and a boat in the wafer boat handling device 110. It can thus be seen that the known vertical batch furnace assembly 54 is relatively complex, in particular regarding mechanical configurations for processing of the cassettes 4.

FIGS. 2, 3, 4A and 4B show, at least in part, examples of a system 2 according to an embodiment of the invention, for processing semiconductor wafer storage cassettes 4 such as FOUPs.

The system 2 comprises a vertical batch furnace assembly 6 configured to process a semiconductor wafer storage cassette 4, the vertical batch furnace assembly 6 comprising a vertical batch furnace 8, e.g. similar to the known vertical batch furnace 56, configured to process wafers 10 from the cassette 4. The vertical batch furnace assembly 6 may further comprise a wafer boat handling device 30, e.g. similar to the known wafer boat handling device 110.

Figure 4A:
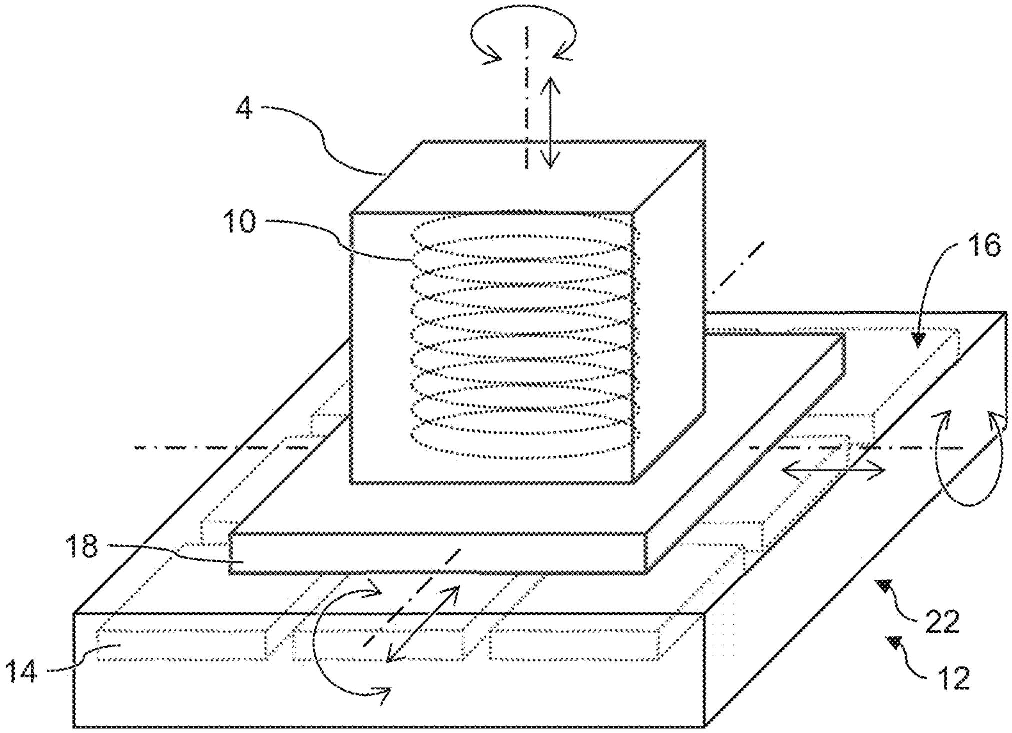
FIGS. 4A and 4B show a perspective view, respectively a side view, of a floor assembly with a platform assembly and a cassette.
Figure 4B:
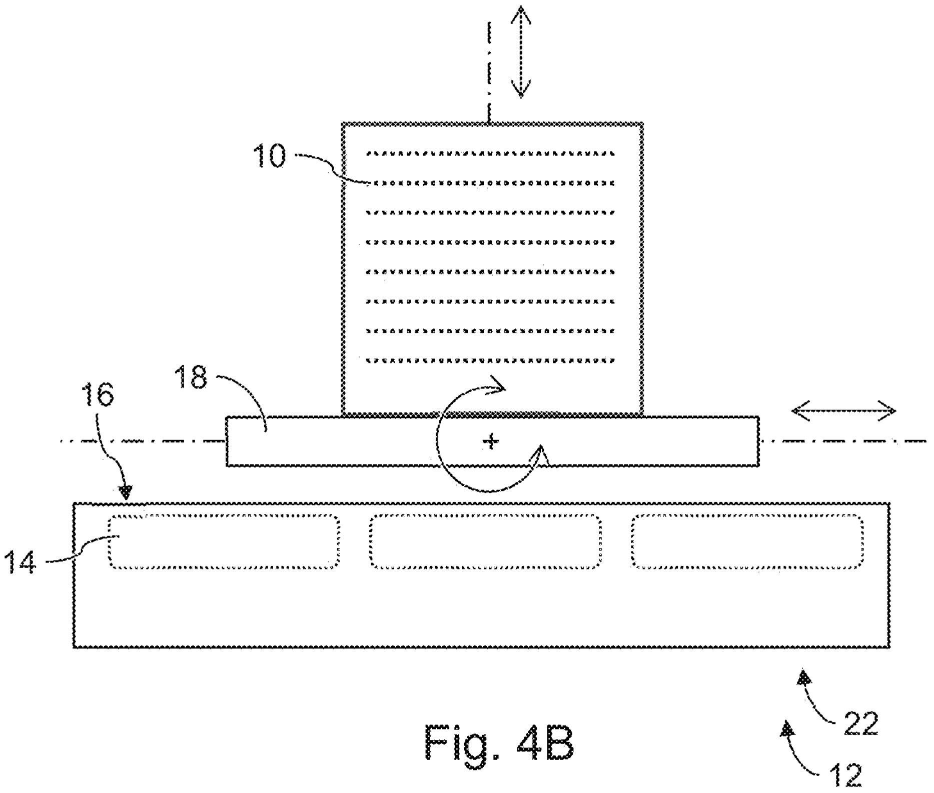

The system 2 comprises a floor assembly 12 arranged at the vertical batch furnace assembly 6, the floor assembly 12 comprising a two-dimensional array of electromagnets 14 arranged below a top surface 16 of the floor assembly 12, the array extending along the top surface 16. As one example, a three-by-three array of such electromagnets 14 can be seen in FIG. 4A, of which only one electromagnet has been provided with a reference sign for the sake of clarity of the drawing. As will be explained elsewhere herein, the array shown in FIG. 4A is part of a floor assembly module 22, wherein the floor assembly 12 may comprise multiple such modules 22 which thereby together form a larger array of electromagnets 14.

Figure 2:
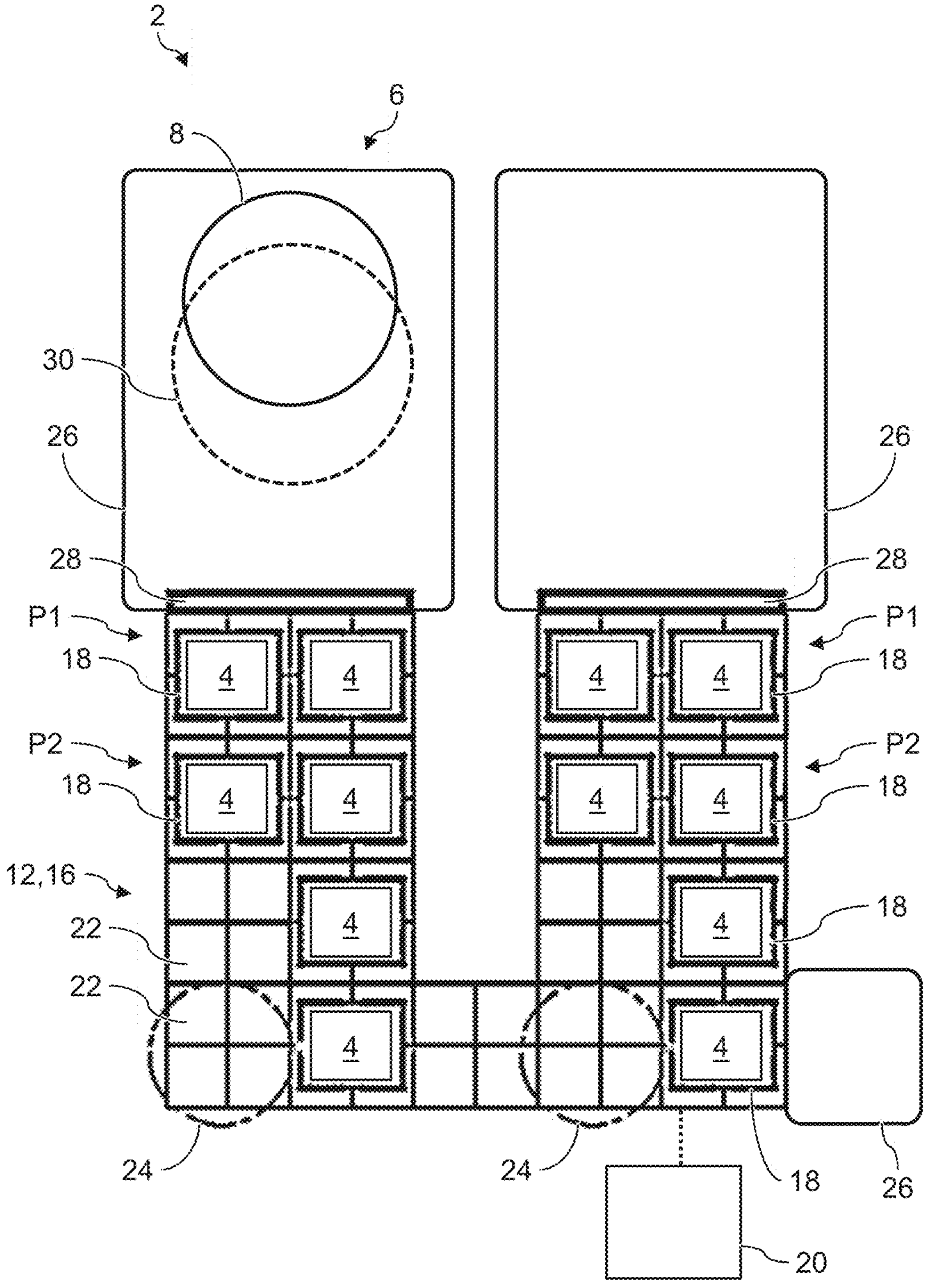
FIG. 2 shows a plan view of a system according to an embodiment.
Figure 3:
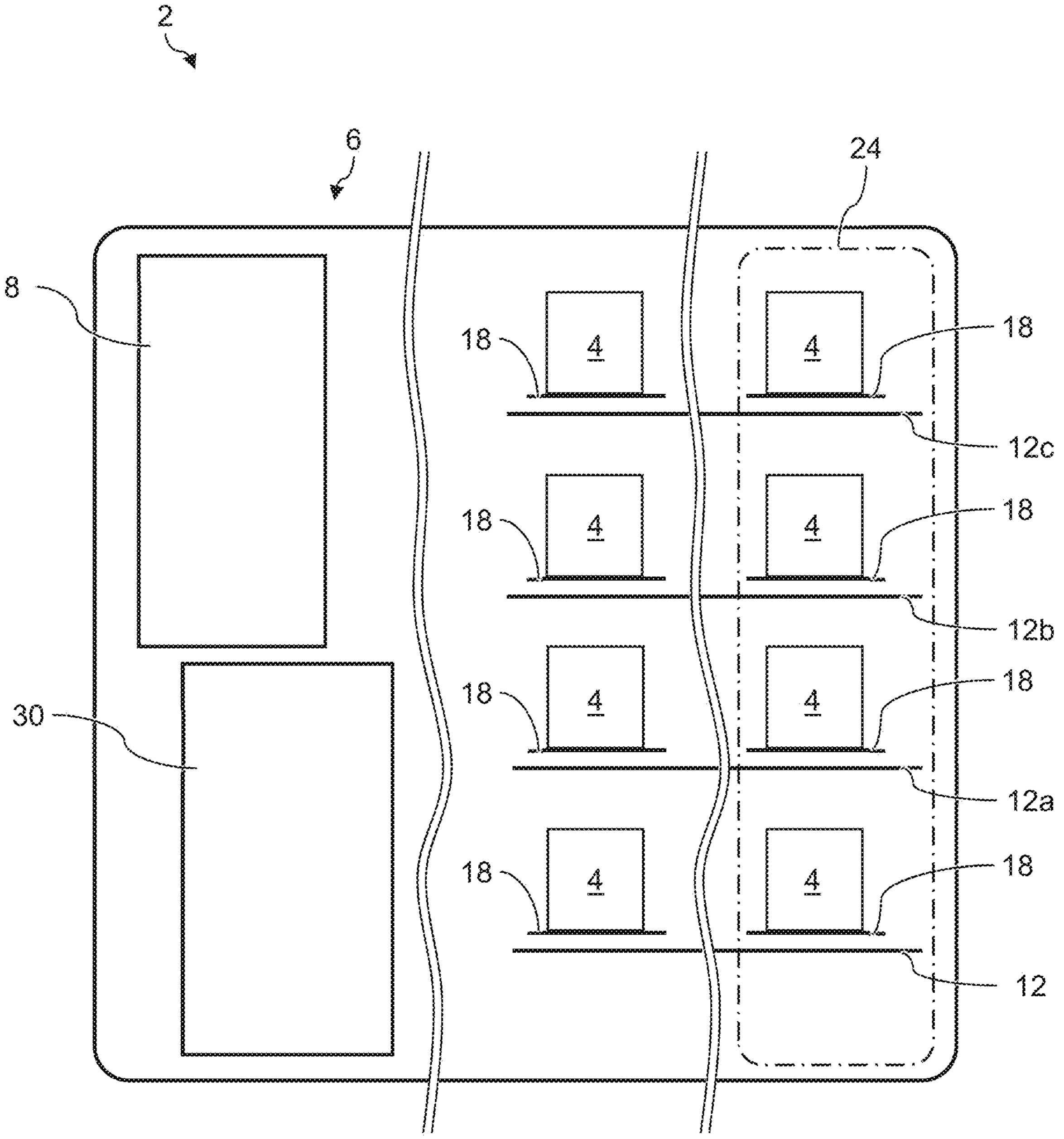
FIG. 3 shows a side view of a system according to an embodiment.

The system 2 comprises at least one platform assembly 18 comprising a magnet and configured to support at least one of the cassettes 4 thereon. In FIG. 2, twelve such platform assemblies 18 are shown of which for the sake of clarity of the drawing only six have been provided with a reference sign 18.

The system 2 is configured for levitating the at least one platform assembly 18 above the top surface 16 of the floor assembly 12 using magnetic interaction between the array of electromagnets 14 and the magnet of the platform assembly 18.

The system 2 comprises a controller 20 operatively connected to the electromagnets 14 of the floor assembly 12. The controller 20 is configured for controlling the electromagnets 14 in a variable manner so as to vary the magnetic interaction for thereby moving the levitated at least one platform assembly 18 with the at least one cassette 4 supported thereon with respect to the floor assembly 12 so as to transport the at least one cassette 4 with respect to the vertical batch furnace 8 for processing of wafers from the cassette 4 by the vertical batch furnace 8.

Preferably, for the processing of the wafers 10, the system 2 further comprises a door opener device 28 arranged at an outer edge of the floor assembly 12 and configured to engage a door of a cassette 4 supported on at least one of the at least one platform assembly 18 while the floor assembly 12, under control of the controller 20, positions the at least one platform assembly 18 at the door opener device 28.

In embodiments, the number of platform assemblies 18 of the at least one platform assembly 18 is at least two. Thereby, multiple cassettes 4 can be processed, in particular transported, substantially independently.

In embodiments, the floor assembly 12 comprises an array of interconnected floor assembly modules 22, each module comprising a respective sub-array of the array of electromagnets 14. Such a modular configuration advantageously provides versatility in the layout of the floor assembly 12 and moreover can facilitate economic production, installation and maintenance. In FIG. 2, two such modules 22 have been indicated by a reference sign 22, while in total 68 such modules are shown there. It shall be appreciated that the number of modules can essentially be chosen freely, i.e. depending on the desired layout of the floor assembly 12. Reference is made to WO2022/106555A1 for a detailed example of a suitable floor assembly module with a suitable platform assembly.

In embodiments, the system 2 further comprises an elevator 24 configured to move at least one cassette 4 of the at least one cassette 4 vertically with respect to the top surface 16. Thereby, the processing of the cassettes 4 can include vertical transportation of cassettes 4, enabling more efficient use of processing space.

In embodiments, the system 2 comprises at least one further floor assembly 12*a*, 12*b*, 12*c*, arranged at a different level than the floor assembly 12. In this way, cassettes 4 can be processed, e.g. transported and/or stored, at multiple vertical levels above each other, promoting spatial efficiency and versatility.

In view of the present description it shall be appreciated that the system 2 may be combined with at least one semiconductor wafer storage cassette 4, wherein at least one cassette 4 of the at least one cassette 4 may be supported on at least one platform assembly 18 of the at least one platform assembly 18, wherein the at least one cassette 4 may contain at least one wafer 10 processed or to be processed by the vertical batch furnace 8.

The system 2 may be combined with a plurality of cassette processing stations 26 (see FIG. 2) arranged at mutually different positions along an outer edge of the top surface 16 of the floor assembly 12, at least one of the cassette processing stations 26 being comprised by or comprising the vertical batch furnace assembly 6. Examples of possible other types of cassette processing stations 26 include, but are not limited to: a cassette storage station, a cassette loading station, a cassette unloading station, a cassette inspection station, and a cassette cooling station. The system 2 is thus highly versatile, allowing to interconnect various cassette processing stations 26 in an easy and reliable manner.

The system 2 may thus be used for processing at least one semiconductor wafer storage cassette 4, wherein the at least one cassette 4 may contain at least one wafer 10 processed or to be processed by the vertical batch furnace 8.

FIGS. 2, 3, 4A and 4B also illustrate a corresponding method of transporting at least one semiconductor wafer storage cassette 4 with respect to a vertical batch furnace 8 of a vertical batch furnace assembly 6. The system 2 is preferably configured to perform this method.

The method comprises: providing, at the vertical batch furnace assembly 6, a floor assembly 12 comprising a two-dimensional array of electromagnets 14 arranged below a top surface 16 of the floor assembly 12, the array extending along the top surface 16; and providing at least one platform assembly 18 comprising a magnet.

The method comprises: supporting at least one semiconductor wafer storage cassette 4 on the at least one platform assembly 18; levitating the at least one platform assembly 18 above the top surface 16 of the floor assembly 12 using magnetic interaction between the array of electromagnets 14 and the magnet of the platform assembly 18; and moving the levitated at least one platform assembly 18 with the at least one cassette 4 supported thereon with respect to the floor assembly 12 by controlling the electromagnets 14 in a variable manner so as to vary the magnetic interaction, thereby transporting the at least one cassette 4 with respect to the vertical batch furnace 8.

The transporting here includes positioning a cassette 4 of the at least one cassette 4 at a door opener device 28 associated with the vertical batch furnace assembly 6, the door opener device 28 being arranged at an outer edge of the floor assembly 12 and being configured to engage a door of a cassette 4 supported on at least one of the at least one platform assembly 18 while the floor assembly 12 positions the at least one platform assembly 18 at the door opener device 28.

In embodiments, the moving has at least two degrees of freedom, preferably at least three degrees of freedom, for example up to six degrees of freedom. In embodiments, the moving comprises translating the at least one platform assembly 18 with respect to the floor assembly 12. In embodiments, the moving comprises rotating the at least one platform assembly 18 with respect to the floor assembly 12. As illustrated in FIG. 4A, such degrees of freedom may thus include three translational directions, including two-dimensional movement along the top surface 16 and lifting/lowering with respect to the top surface, and three rotational directions, including tilting about two axes parallel to the top surface 16 and swiveling about an axis normal to the top surface 16. The moving can thus be highly versatile, in particular when compared to traditional methods in which the moving is determined by mechanical mechanisms configured to provide some degree of freedom while constraining others.

As indicated elsewhere herein, in embodiments, the number of platform assemblies 18 of the at least one platform assembly 18 is at least two. In embodiments, the moving of the at least two platform assemblies 18 is at least partly contemporaneous. In embodiments, the moving of the at least two platform assemblies 18 is at least partly sequential. Thus, a movement of one cassette 4 partly or fully or not at all overlap in time with a movement of another cassette 4. Cassette movements can thus be controlled essentially as desired for optimal efficiency, as long as sufficient space can be made available on the top surface 16. In embodiments, the moving comprises positioning at least one of the platform assemblies 18 at a former position of another of the platform assemblies 18. In embodiments, the moving comprises mutually exchanging positions among at least two of the platform assemblies 18. As shown in FIG. 2, some amount of free space is preferably left on the top surface 16 to allow platform assemblies 18 to be moved around thereon, somewhat similar to how puzzle pieces are moved around in a so-called sliding tile puzzle. Thereby, a relatively large portion of the space on the top surface 16 can be utilized for storage and/or transportation of cassettes 4, while individual cassettes 4 can still be positioned and moved as desired.

In embodiments, the number of cassettes 4 of the at least one cassette 4 is at least two, wherein at least two cassettes 4 of the at least two cassettes 4 are supported on mutually different ones of the at least two platform assemblies 18. Thereby, such cassettes 4 can be moved mutually substantially independently.

Alternatively, depending on sizes of the cassettes 4 and the platform assemblies 18, two cassettes could be supported on a same platform assembly. Also, in case of a relatively large and/or heavy cassette, a single cassette could be supported on multiple platform assemblies, in which case those platform assemblies would be moved together while supporting the cassette.

In embodiments, the platform assemblies 18 are arranged on the floor assembly 12 in an array, for example a one-dimensional or two-dimensional array. Such an arrangement provides efficient use of space.

In embodiments, the method further comprises lowering at least one cassette 4 of the at least one cassette 4 towards the top surface 16 using an elevator 24. In embodiments, the cassette 4 is lowered onto at least one of the at least one platform assembly 18. In embodiments, the cassette 4 is lowered together with at least one of the at least one platform assembly 18.

In embodiments, the method further comprises lifting at least one cassette 4 of the at least one cassette 4 away from the top surface 16 using an elevator 24. In embodiments, the cassette 4 is lifted from at least one of the at least one platform assembly 18. In embodiments, the cassette 4 is lifted together with at least one of the at least one platform assembly 18.

Thus, the elevator 24 may be configured to lift and/or lower cassettes 4 with or without an associated platform assembly 18. In case a cassette 4 is lifted from its platform assembly 18, this platform assembly then becomes available for receiving a different cassette thereon. It shall be appreciated that, in some embodiments, the elevator 24 could also lift and/or lower platform assemblies without cassettes, for example to redistribute platform assemblies 18 among floor assemblies 12, 12*a-c*.

As indicated elsewhere herein, in embodiments, a plurality of cassette processing stations 26 are arranged at mutually different positions along an outer edge of the top surface

16. In embodiments, with reference to FIG. 2, the moving is between a first position P1 where one of the processing stations 26 can process the cassette 4 and a second position P2 wherein said one of the processing stations 26 cannot process the cassette 4, wherein the second position P2 may be a position where another one of the processing stations 26 can process the cassette 4. For example, such a first position P1 may be adjacent a door opener device 28 of a processing station 26, in which case the first position P1 may be a wafer transfer position in which the door opener device 28 can engage a door of the cassette 4 for transfer of wafers 10 from and/or to the cassette 4, in particular for processing of such wafers 10 in the processing station 26, e.g. in the vertical batch furnace assembly 6, as alluded to elsewhere herein. Thus, wafers 10 may be transferred to and/or from a cassette 4 without the cassette 4 leaving the respective platform device 18, thereby further obviating traditional cassette handling equipment such as pistons as used in traditional systems to enable engagement between a cassette and a door opener device.

Although the invention has been explained using examples of embodiments and drawings, these do not limit the scope of the invention as defined by the claims. Within said scope, many variations, combinations and extensions are possible, as will be appreciated by the skilled person. For example, a system according to the invention may comprise one or more carousel assemblies, turn table assemblies, handler robots and/or pneumatic elements, for example for cooperation with one or more floor assemblies and respective platform assemblies.

The invention claimed is:

1. A system for processing semiconductor wafer storage cassettes, comprising:

a vertical batch furnace assembly configured to process at least one semiconductor wafer storage cassette, the vertical batch furnace assembly comprising a vertical batch furnace configured to process wafers from the at least one cassette;

a floor assembly arranged at the vertical batch furnace assembly, the floor assembly comprising a two-dimensional array of electromagnets arranged below a top surface of the floor assembly, the array extending along the top surface;

at least one platform assembly comprising a magnet and configured to support the at least one cassette thereon; and a controller operatively connected to the electromagnets of the floor assembly, wherein the system is configured for levitating the at least one platform assembly above the top surface of the floor assembly using magnetic interaction between the array of electromagnets and the magnet of the platform assembly, wherein the controller is configured for controlling the electromagnets in a variable manner so as to vary the magnetic interaction for thereby moving the levitated at least one platform assembly with the at least one cassette supported thereon with respect to the floor assembly so as to transport the at least one cassette with respect to the vertical batch furnace for processing of wafers from the at least one cassette by the vertical batch furnace, wherein the system further comprises a door opener device arranged at an outer edge of the floor assembly and configured to engage a door of a cassette supported on at least one of the at least one platform assembly while the floor assembly positions the at least one platform assembly at the door opener device.

2. The system according to claim 1, wherein the number of platform assemblies of the at least one platform assembly is at least two.

3. The system according to claim 1, wherein the floor assembly comprises an array of interconnected floor assembly modules, each module comprising a respective sub-array of the array of electromagnets.

4. The system according to claim 1, further comprising an elevator configured to move at least one cassette of the at least one cassette vertically with respect to the top surface.

5. The system according to claim 1, comprising at least one further floor assembly arranged at a different level than the floor assembly.

6. A combination of the system according to claim 1 and the at least one semiconductor wafer storage cassette, wherein at least one cassette of the at least one cassette is supported on at least one platform assembly of the at least one platform assembly.

7. The combination according to claim 6, wherein the at least one cassette contains at least one wafer processed or to be processed by the vertical batch furnace.

8. A combination of the system according to claim 1 and a plurality of cassette processing stations arranged at mutually different positions along an outer edge of the top surface of the floor assembly, at least one of the cassette processing stations being comprised by or comprising the vertical batch furnace assembly.

9. The system according to claim 1, wherein the two-dimensional array of electromagnets is configured to enable two-dimensional translational movement of the levitated at least one platform assembly along the top surface of the floor assembly.

* * * * *